(12) United States Patent
Bae et al.

(10) Patent No.: US 11,876,515 B2
(45) Date of Patent: Jan. 16, 2024

(54) TRANSCEIVER AND METHOD OF DRIVING THE SAME

(71) Applicant: SAMSUNG DISPLAY CO., LTD., Yongin-si (KR)

(72) Inventors: Jong Man Bae, Yongin-si (KR); Hyun Su Kim, Yongin-si (KR); Jun Dal Kim, Yongin-si (KR); Dong Won Park, Yongin-si (KR); Young Suk Jung, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 49 days.

(21) Appl. No.: 17/825,622

(22) Filed: May 26, 2022

(65) Prior Publication Data

US 2023/0163763 A1 May 25, 2023

(30) Foreign Application Priority Data

Nov. 19, 2021 (KR) .......................... 10-2021-0160724

(51) Int. Cl.
*H03K 19/0175* (2006.01)
*H03K 9/02* (2006.01)
*H03K 7/02* (2006.01)

(52) U.S. Cl.
CPC ....... *H03K 19/017545* (2013.01); *H03K 7/02* (2013.01); *H03K 9/02* (2013.01)

(58) Field of Classification Search
None
See application file for complete search history.

(56) References Cited

U.S. PATENT DOCUMENTS

| 7,667,493 | B2 | 2/2010 | Choi et al. | |
|---|---|---|---|---|
| 2010/0102853 | A1* | 4/2010 | Hollis | G11C 7/02 326/86 |
| 2014/0184299 | A1* | 7/2014 | Chung | H03K 3/356182 327/333 |
| 2023/0253018 | A1* | 8/2023 | Park | G11C 11/565 365/189.09 |

FOREIGN PATENT DOCUMENTS

| KR | 10-0875667 | 12/2008 |
|---|---|---|
| KR | 10-2009-0001356 | 1/2009 |
| KR | 10-2207413 | 1/2021 |

* cited by examiner

*Primary Examiner* — Jany Richardson
(74) *Attorney, Agent, or Firm* — F. Chau & Associates, LLC

(57) ABSTRACT

A transceiver includes a transmitter and a receiver coupled to each other through a first line and a second line. The transmitter transmits a first voltage signal of a second logic level or a fourth logic level, among a first logic level, the second logic level, a third logic level, and the fourth logic level, through the first line. The transmitter transmits a second voltage signal of the first logic level or the third logic level through the second line. The receiver generates an output signal having one of four values based on the first voltage signal and the second voltage signal.

20 Claims, 10 Drawing Sheets

FIG. 4

| PATTERN | | COMPARATOR | | DECODER | |
|---|---|---|---|---|---|
| | | IN | OUT | IN | OUT |
| PTA | CP6 | DPs(LV4) | VTH3 | High "1" | 111_000 | 10 |
| | CP5 | | VTH2 | High "1" | | |
| | CP4 | | VTH1 | High "1" | | |
| | CP3 | DNs(LV1) | VTH3 | Low "0" | | |
| | CP2 | | VTH2 | Low "0" | | |
| | CP1 | | VTH1 | Low "0" | | |
| PTB | CP6 | DPs(LV4) | VTH3 | High "1" | 111_011 | 11 |
| | CP5 | | VTH2 | High "1" | | |
| | CP4 | | VTH1 | High "1" | | |
| | CP3 | DNs(LV3) | VTH3 | Low "0" | | |
| | CP2 | | VTH2 | High "1" | | |
| | CP1 | | VTH1 | High "1" | | |
| PTC | CP6 | DPs(LV2) | VTH3 | Low "0" | 001_000 | 00 |
| | CP5 | | VTH2 | Low "0" | | |
| | CP4 | | VTH1 | High "1" | | |
| | CP3 | DNs(LV1) | VTH3 | Low "0" | | |
| | CP2 | | VTH2 | Low "0" | | |
| | CP1 | | VTH1 | Low "0" | | |
| PTD | CP6 | DPs(LV2) | VTH3 | Low "0" | 001_011 | 01 |
| | CP5 | | VTH2 | Low "0" | | |
| | CP4 | | VTH1 | High "1" | | |
| | CP3 | DNs(LV3) | VTH3 | Low "0" | | |
| | CP2 | | VTH2 | High "1" | | |
| | CP1 | | VTH1 | High "1" | | |

FIG. 8

| PATTERN | COMPARATOR | | | DECODER | |
|---|---|---|---|---|---|
| | | IN | OUT | IN | OUT |
| PTA | CP2b | DPs(LV4) | VTH2b | High "1" | 1_0 | 10 |
| | CP1b | DNs(LV1) | VTH1b | Low "0" | | |
| PTB | CP2b | DPs(LV4) | VTH2b | High "1" | 1_1 | 11 |
| | CP1b | DNs(LV3) | VTH1b | High "1" | | |
| PTC | CP2b | DPs(LV2) | VTH2b | Low "0" | 0_0 | 00 |
| | CP1b | DNs(LV1) | VTH1b | Low "0" | | |
| PTD | CP2b | DPs(LV2) | VTH2b | Low "0" | 0_1 | 01 |
| | CP1b | DNs(LV3) | VTH1b | High "1" | | |

TRANSCEIVER AND METHOD OF DRIVING THE SAME

CROSS-REFERENCE TO RELATED APPLICATION

This application claims priority under 35 U.S.C. § 119 to Korean Patent Application No. 10-2021-0160724 filed on Nov. 19, 2021, the disclosure of which is incorporated by reference herein in its entirety.

TECHNICAL FIELD

Embodiments of the present disclosure relate to a transceiver and a method of driving the transceiver.

DISCUSSION OF RELATED ART

As advancements in information technology are made, among data transmission techniques used for transmitting data between a plurality of devices, techniques such as, for example, Pulse Amplitude Modulation 4 (PAM4), Non Return to Zero (NRZ), etc. are being used for modulation.

PAM4 is widely being used for transmission of high-resolution and high-frequency data because it enables transmission of twice as much data compared to NRZ. However, because a voltage swing level for each line is large, PAM4 has poor signal integrity (SI) as the speed at which data is transmitted increases, and thus, eye margin characteristics may be difficult to secure. Also, when compared with NRZ, power consumption of PAM4 may increase depending on an increase in the number of swing levels and the implementation of multi-level.

SUMMARY

Various embodiments of the present disclosure are directed to a transceiver, which is capable of securing high signal integrity (SI) characteristics and reducing power consumption while maintaining the same data transmission rate when compared with an existing PAM4 method, and a method of driving the transceiver.

An embodiment of the present disclosure may provide for a transceiver. The transceiver may include a transmitter and a receiver coupled to each other through a first line and a second line. The transmitter may transmit a first voltage signal of a second logic level or a fourth logic level, among a first logic level, the second logic level, a third logic level, and the fourth logic level, through the first line. The transmitter may transmit a second voltage signal of the first logic level or the third logic level through the second line. The receiver may generate an output signal having one of four values based on the first voltage signal and the second voltage signal.

The second logic level may be higher than the first logic level, the third logic level may be higher than the second logic level, and the fourth logic level may be higher than the third logic level.

The receiver may compare the second voltage signal with each of a first threshold voltage, a second threshold voltage, and a third threshold voltage, and may generate a first bit corresponding to a comparison result.

The receiver may compare the first voltage signal with each of the first threshold voltage, the second threshold voltage, and the third threshold voltage, and may generate a second bit corresponding to a comparison result.

The receiver may generate a bit string in which the first bit and the second bit are combined as the output signal.

The second threshold voltage may be higher than the first threshold voltage, and the third threshold voltage may be higher than the second threshold voltage.

The first threshold voltage may be higher than the second voltage signal of the first logic level, the first voltage signal of the second logic level may be higher than the first threshold voltage, the second threshold voltage may be higher than the first voltage signal of the second logic level, the second voltage signal of the third logic level may be higher than the second threshold voltage, the third threshold voltage may be higher than the second voltage signal of the third logic level, and the first voltage signal of the fourth logic level may be higher than the third threshold voltage.

The receiver may include a first comparator configured to compare a first threshold voltage with the second voltage signal and generate a first comparison result, a second comparator configured to compare a second threshold voltage with the second voltage signal and generate a second comparison result, a third comparator configured to compare a third threshold voltage with the second voltage signal and generate a third comparison result, a fourth comparator configured to compare the first threshold voltage with the first voltage signal and generate a fourth comparison result, a fifth comparator configured to compare the second threshold voltage with the first voltage signal and generate a fifth comparison result, and a sixth comparator configured to compare the third threshold voltage with the first voltage signal and generate a sixth comparison result.

The receiver may further include an equalizer configured to equalize the first voltage signal and transfer the first voltage signal to the fourth to sixth comparators and configured to equalize the second voltage signal and transfer the second voltage signal to the first to third comparators, and a decoder configured to generate the output signal based on the first to sixth comparison results.

The receiver may compare the second voltage signal with a first threshold voltage and generate a first bit corresponding to a comparison result, may compare the first voltage signal with a second threshold voltage and generate a second bit corresponding to a comparison result, and may generate a bit string in which the first bit and the second bit are combined as the output signal.

The second threshold voltage may be higher than the first threshold voltage.

The first threshold voltage may be higher than the second voltage signal of the first logic level, the second voltage signal of the third logic level may be higher than the first threshold voltage, the second threshold voltage may be higher than the first voltage signal of the second logic level, and the first voltage signal of the fourth logic level may be higher than the second threshold voltage.

The receiver may include a first comparator configured to compare a first threshold voltage with the second voltage signal and generate a first comparison result, and a second comparator configured to compare a second threshold voltage with the first voltage signal and generate a second comparison result.

The receiver may further include an equalizer configured to equalize the first voltage signal and transfer the first voltage signal to the second comparator and configured to equalize the second voltage signal and transfer the second voltage signal to the first comparator, and a decoder configured to generate the output signal based on the first and second comparison results.

An embodiment of the present disclosure may provide for a method of driving a transceiver, including a transmitter and a receiver coupled to each other through a first line and a second line. The method may include transmitting, by the transmitter, a first voltage signal of a second logic level or a fourth logic level, among a first logic level, the second logic level, a third logic level, and the fourth logic level, through the first line, transmitting, by the transmitter, a second voltage signal of the first logic level or the third logic level through the second line, and generating, by the receiver, an output signal having one of four values based on the first voltage signal and the second voltage signal.

The second logic level may be higher than the first logic level, the third logic level may be higher than the second logic level, and the fourth logic level may be higher than the third logic level.

The method may further include comparing, by the receiver, the second voltage signal with each of a first threshold voltage, a second threshold voltage, and a third threshold voltage and generating, by the receiver, a first bit corresponding to a comparison result, comparing, by the receiver, the first voltage signal with each of the first threshold voltage, the second threshold voltage, and the third threshold voltage and generating, by the receiver, a second bit corresponding to a comparison result, and generating, by the receiver, a bit string in which the first bit and the second bit are combined as the output signal.

The first threshold voltage may be higher than the second voltage signal of the first logic level, the first voltage signal of the second logic level may be higher than the first threshold voltage, the second threshold voltage may be higher than the first voltage signal of the second logic level, the second voltage signal of the third logic level may be higher than the second threshold voltage, the third threshold voltage may be higher than the second voltage signal of the third logic level, and the first voltage signal of the fourth logic level may be higher than the third threshold voltage.

The method may further include comparing, by the receiver, the second voltage signal with a first threshold voltage and generating, by the receiver, a first bit corresponding to a comparison result, comparing, by the receiver, the first voltage signal with a second threshold voltage and generating, by the receiver, a second bit corresponding to a comparison result, and generating, by the receiver, a bit string in which the first bit and the second bit are combined as the output signal.

The first threshold voltage may be higher than the second voltage signal of the first logic level, the second voltage signal of the third logic level may be higher than the first threshold voltage, the second threshold voltage may be higher than the first voltage signal of the second logic level, and the first voltage signal of the fourth logic level may be higher than the second threshold voltage.

BRIEF DESCRIPTION OF THE DRAWINGS

The above and other features of the present disclosure will become more apparent by describing in detail embodiments thereof with reference to the accompanying drawings, in which:

FIGS. 2 to 4 are diagrams illustrating the operation of a transceiver according to an embodiment of the present disclosure.

FIGS. 6 to 8 are diagrams illustrating the operation of a transceiver according to an embodiment of the present disclosure.

DETAILED DESCRIPTION

Figure 1:
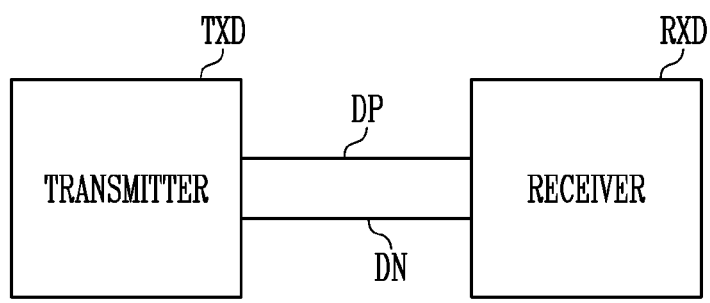
FIG. 1 is a diagram illustrating a transceiver according to an embodiment of the present disclosure.

Embodiments of the present disclosure will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an embodiment may be described as a "second" element in another embodiment.

It should be understood that descriptions of features or aspects within each embodiment should typically be considered as available for other similar features or aspects in other embodiments, unless the context clearly indicates otherwise.

As used herein, the singular forms "a", "an" and "the" are intended to include the plural forms as well, unless the context clearly indicates otherwise.

Herein, when one value is described as being about equal to another value or being substantially the same as or equal to another value, it is to be understood that the values are identical, the values are equal to each other within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations as understood by one of the ordinary skill in the art. Further, it is to be understood that while parameters may be described herein as having "about" a certain value, according to exemplary embodiments, the parameter may be exactly the certain value or approximately the certain value within a measurement error as would be understood by a person having ordinary skill in the art.

FIG. 1 is a diagram illustrating a transceiver according to an embodiment of the present disclosure.

Referring to FIG. 1, a transceiver TSCV according to an embodiment of the present disclosure may include a transmitter TXD and a receiver RXD.

The transmitter TXD and the receiver RXD may be coupled to each other through a first line DP and a second line DN. Based on an input signal, the transmitter TXD may transmit a first voltage signal through the first line DP and transmit a second voltage signal through the second line DN. The receiver RXD may generate an output signal based on the first voltage signal and the second voltage signal. The input signal and the output signal may be digital signals (e.g., bit strings) having the same information.

The first line DP and the second line DN may form a single data channel. When the transceiver TSCV includes a plurality of data channels, other first lines and second lines may be further included.

Figure 2:
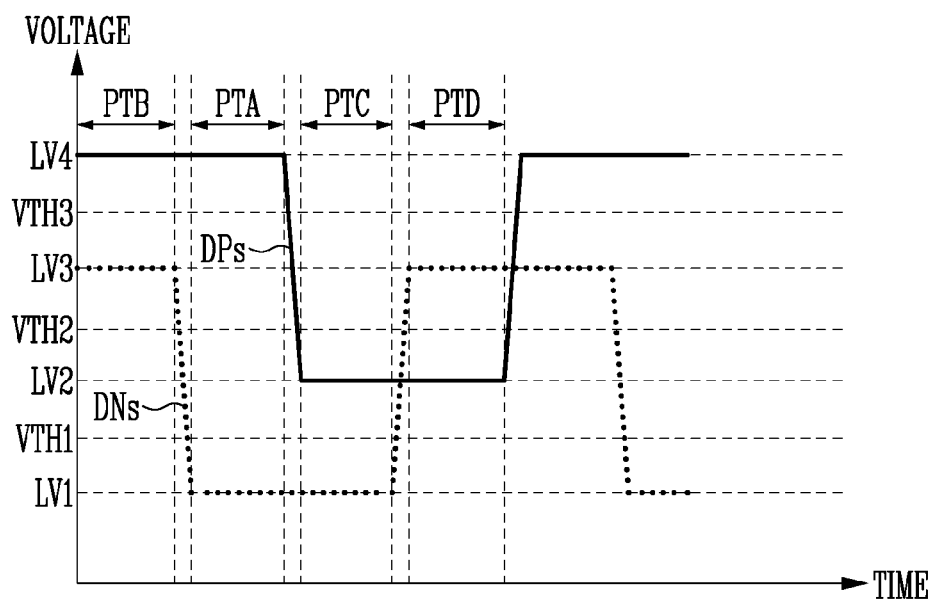
Figure 3:
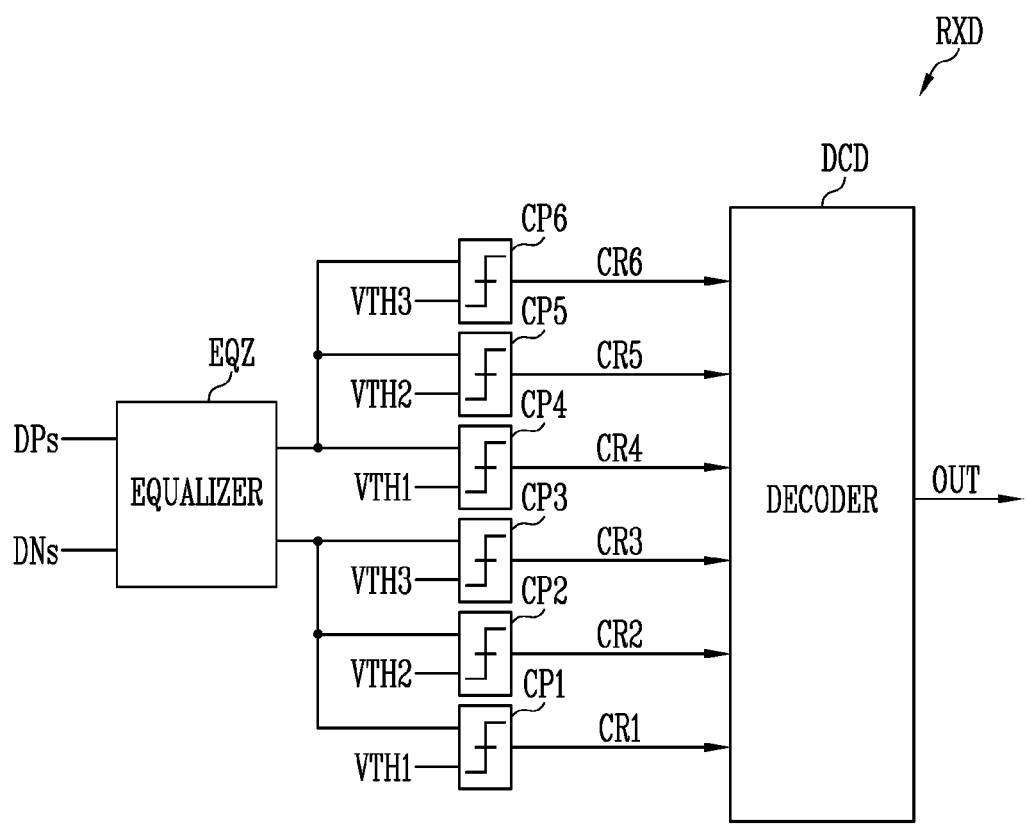

FIGS. 2 to 4 are diagrams illustrating the operation of a transceiver according to an embodiment of the present disclosure.

Referring to FIG. 2, a graph of a first voltage signal DPs and a second voltage signal DNs is illustrated. The horizontal axis of the graph corresponds to time, and the vertical axis thereof corresponds to a voltage.

A transmitter TXD may transmit the first voltage signal DPs through a first line DP and transmit the second voltage signal DNs through a second line DN. The first voltage signal DPs may have a second logic level LV2 or a fourth logic level LV4. In an embodiment according to FIG. 2, the first voltage signal DPs does not have a first logic level LV1 or a third logic level LV3. Meanwhile, the second voltage signal DNs may have the first logic level LV1 or the third logic level LV3. In an embodiment according to FIG. 2, the second voltage signal DNs does not have the second logic level LV2 or the fourth logic level LV4.

Therefore, according to an embodiment according to FIG. 2, because each of the first voltage signal DPs and the second voltage signal DNs swings between two voltage levels, power consumption may be reduced and implementation may be made more efficient, compared to an existing Pulse Amplitude Modulation 4 (PAM4) method in which signals swing between four voltage levels.

According to an embodiment, the difference between the first logic level LV1 and the third logic level LV3 may be equal to the difference between the second logic level LV2 and the fourth logic level LV4. Accordingly, a slew rate is constant and jitter is small, so high signal integrity (SI) may be provided. Also, high SI results in good eye margin characteristics.

In an embodiment, the second logic level LV2 may be higher than the first logic level LV1, the third logic level LV3 may be higher than the second logic level LV2, and the fourth logic level LV4 may be higher than the third logic level LV3. For example, the first logic level LV1 may be about 300 mV, the second logic level LV2 may be about 500 mV, the third logic level LV3 may be about 700 mV, and the fourth logic level LV4 may be about 900 mV.

The receiver RXD may generate an output signal OUT based on the first voltage signal DPs and the second voltage signal DNs. The output signal OUT may have one of four values (also referred to herein as patterns). For example, when the first voltage signal DPs corresponds to the fourth logic level LV4 and when the second voltage signal DNs corresponds to the first logic level LV1, the receiver RXD may generate an output signal OUT corresponding to a first pattern PTA. When the first voltage signal DPs corresponds to the fourth logic level LV4 and when the second voltage signal DNs corresponds to the third logic level LV3, the receiver RXD may generate an output signal OUT corresponding to a second pattern PTB. When the first voltage signal DPs corresponds to the second logic level LV2 and when the second voltage signal DNs corresponds to the first logic level LV1, the receiver RXD may generate an output signal OUT corresponding to a third pattern PTC. When the first voltage signal DPs corresponds to the second logic level LV2 and when the second voltage signal DNs corresponds to the third logic level LV3, the receiver RXD may generate an output signal OUT corresponding to a fourth pattern PTD.

The receiver RXD compares the second voltage signal DNs with each of a first threshold voltage VTH1, a second threshold voltage VTH2, and a third threshold voltage VTH3, thereby checking the logic level to which the second voltage signal DNs corresponds. The receiver RXD compares the first voltage signal DPs with each of the first threshold voltage VTH1, the second threshold voltage VTH2, and the third threshold voltage VTH3, thereby checking the logic level to which the first voltage signal DPs corresponds. The second threshold voltage VTH2 may be higher than the first threshold voltage VTH1, and the third threshold voltage VTH3 may be higher than the second threshold voltage VTH2.

The first threshold voltage VTH1 may be higher than the second voltage signal DNs of the first logic level LV1. The first voltage signal DPs of the second logic level LV2 may be higher than the first threshold voltage VTH1. The second threshold voltage VTH2 may be higher than the first voltage signal DPs of the second logic level LV2. The second voltage signal DNs of the third logic level LV3 may be higher than the second threshold voltage VTH2. The third threshold voltage VTH3 may be higher than the second voltage signal DNs of the third logic level LV3. The first voltage signal DPs of the fourth logic level LV4 may be higher than the third threshold voltage VTH3.

Referring to FIG. 3, a receiver RXD according to an embodiment of the present disclosure may include an equalizer EQZ, first to sixth comparators CP1, CP2, CP3, CP4, CP5 and CP6, and a decoder DCD.

The receiver RXD may compare the second voltage signal DNs with each of the first threshold voltage VTH1, the second threshold voltage VTH2, and the third threshold voltage VTH3, and may generate a first bit (0 or 1) corresponding to the comparison results CR1, CR2 and CR3. The receiver RXD may compare the first voltage signal DPs with each of the first threshold voltage VTH1, the second threshold voltage VTH2, and the third threshold voltage VTH3, and may generate a second bit (0 or 1) corresponding to the comparison results CR4, CR5 and CR6. The receiver RXD may generate a bit string in which the first bit and the second bit are combined as an output signal OUT. For example, the first bit may be set as the Least Significant Bit (LSB) of the output signal OUT, and the second bit may be set as the Most Significant Bit (MSB) of the output signal OUT.

The equalizer EQZ may equalize the first voltage signal DPs and transfer the same to the fourth to sixth comparators CP4, CP5 and CP6, and may equalize the second voltage signal DNs and transfer the same to the first to third comparators CP1, CP2 and CP3.

When compared with low frequency components of data, the higher frequency components of data may be more affected by a channel and more attenuated. The equalizer EQZ matches all of the frequency components of data to have similar magnitudes (amplitudes), thereby increasing performance, which is evaluated with jitter and an eye diagram. Accordingly, Inter-Symbol Interference (ISI) on a receiver side may be reduced. The equalizer EQZ may employ existing techniques such as, for example, Continuous Time Linear Equalization (CTLE), a detailed description of which will be omitted for convenience of explanation. In an embodiment, the equalizer EQZ may be omitted.

The first comparator CP1 may compare the first threshold voltage VTH1 with the second voltage signal DNs and generate a first comparison result CR1. The first comparison result CR1 may include a single bit (0 or 1). For example, when the second voltage signal DNs is higher than the first threshold voltage VTH1, the first comparison result CR1 may be 1, and when the second voltage signal DNs is lower than the first threshold voltage VTH1, the first comparison result CR1 may be 0. The first comparator CP1 may be a slicer.

The second comparator CP2 may compare the second threshold voltage VTH2 with the second voltage signal DNs and generate a second comparison result CR2. The second comparison result CR2 may include a single bit (0 or 1). For example, when the second voltage signal DNs is higher than the second threshold voltage VTH2, the second comparison result CR2 may be 1, and when the second voltage signal DNs is lower than the second threshold voltage VTH2, the second comparison result CR2 may be 0. The second comparator CP2 may be a slicer.

The third comparator CP3 may compare the third threshold voltage VTH3 with the second voltage signal DNs and generate a third comparison result CR3. The third comparison result CR3 may include a single bit (0 or 1). For example, when the second voltage signal DNs is higher than the third threshold voltage VTH3, the third comparison result CR3 may be 1, and when the second voltage signal DNs is lower than the third threshold voltage VTH3, the third comparison result CR3 may be 0. The third comparator CP3 may be a slicer.

The fourth comparator CP4 may compare the first threshold voltage VTH1 with the first voltage signal DPs and generate a fourth comparison result CR4. The fourth comparison result CR4 may include a single bit (0 or 1). For example, when the first voltage signal DPs is higher than the first threshold voltage VTH1, the fourth comparison result CR4 may be 1, and when the first voltage signal DPs is lower than the first threshold voltage VTH1, the fourth comparison result CR4 may be 0. The fourth comparator CP4 may be a slicer.

The fifth comparator CP5 may compare the second threshold voltage VTH2 with the first voltage signal DPs and generate a fifth comparison result CR5. The fifth comparison result CR5 may include a single bit (0 or 1). For example, when the first voltage signal DPs is higher than the second threshold voltage VTH2, the fifth comparison result CR5 may be 1, and when the first voltage signal DPs is lower than the second threshold voltage VTH2, the fifth comparison result CR5 may be 0. The fifth comparator CP5 may be a slicer.

The sixth comparator CP6 may compare the third threshold voltage VTH3 with the first voltage signal DPs and generate a sixth comparison result CR6. The sixth comparison result CR6 may include a single bit (0 or 1). For example, when the first voltage signal DPs is higher than the third threshold voltage VTH3, the sixth comparison result CR6 may be 1, and when the first voltage signal DPs is lower than the third threshold voltage VTH3, the sixth comparison result CR6 may be 0. The sixth comparator CP6 may be a slicer.

The decoder DCD may generate an output signal OUT based on the first to sixth comparison results CR1, CR2, CR3, CR4, CR5 and CR6. The decoder DCD may generate a first bit (0 or 1) corresponding to the comparison results CR1, CR2 and CR3. Also, the decoder DCD may generate a second bit (0 or 1) corresponding to the comparison results CR4, CR5 and CR6. The decoder DCD may generate a bit string in which the first bit and the second bit are combined as an output signal OUT. For example, the first bit may be set as the LSB of the output signal OUT, and the second bit may be set as the MSB of the output signal OUT. The decoder DCD may correspond to a thermometer-to-binary block.

FIG. 4 is a table illustrating the output signals OUT that are output from the decoder DCD when the respective patterns PTA, PTB, PTC and PTD are transmitted through the first line DP and the second line DN, as described with reference to FIG. 2 and FIG. 3.

Figure 5:
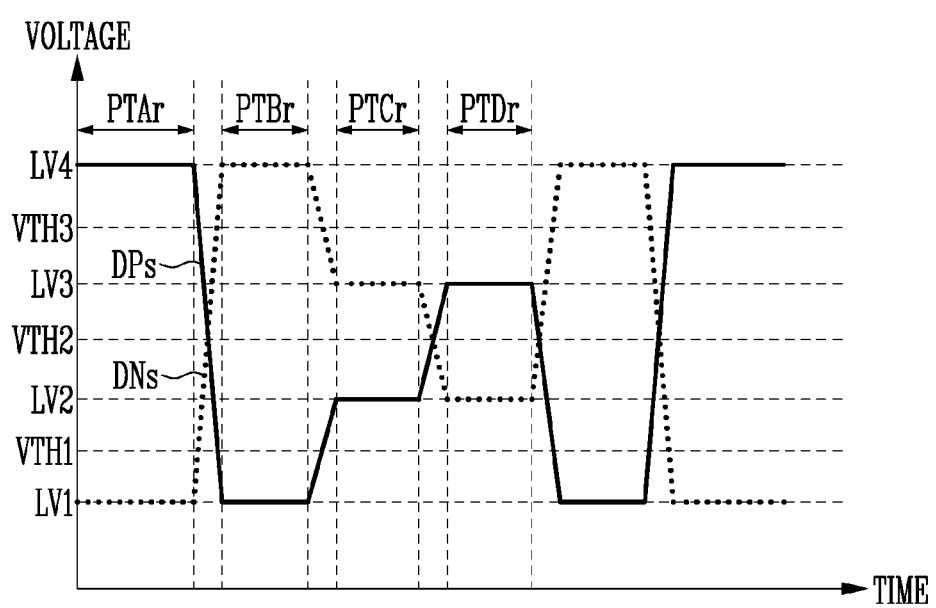
FIG. 5 is a diagram illustrating that the receiver of FIG. 3 is applicable to an existing Pulse Amplitude Modulation 4 (PAM4) method.

FIG. 5 is a diagram illustrating that the receiver of FIG. 3 is also applicable to an existing PAM4 method.

Referring to FIG. 5, the case in which a transceiver TSCV operates according to a conventional PAM4 method is illustrated. Here, a first voltage signal DPs may have one of a first logic level LV1, a second logic level LV2, a third logic level LV3, and a fourth logic lever LV4. Also, a second voltage signal DNs may have one of the first logic level LV1, the second logic level LV2, the third logic level LV3, and the fourth logic level LV4.

Referring to the comparators CP1 to CP6 of the receiver RXD in FIG. 3, the respective logic levels LV1, LV2, LV3 and LV4 of the first voltage signal DPs and the second voltage signal DNs may be determined. Accordingly, if the mapping relationships between the input signal IN and the output signal OUT of the decoder DCD are further preset for the respective patterns PTAr, PTBr, PTCr and PTDr, the receiver RXD according to embodiments of the present disclosure is capable of also being used for the existing PAM4 method.

Figure 6:
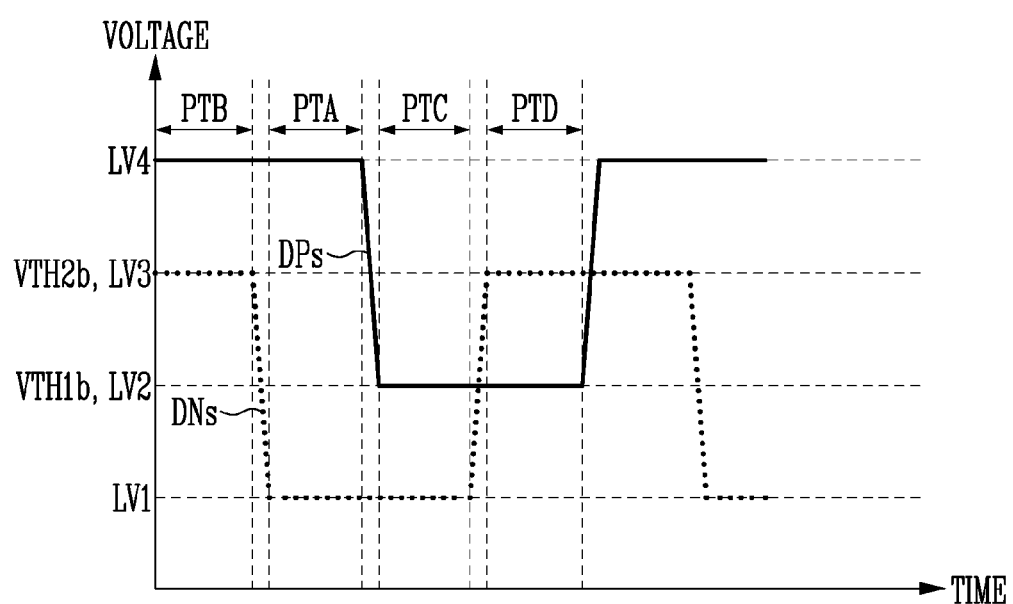
Figure 7:
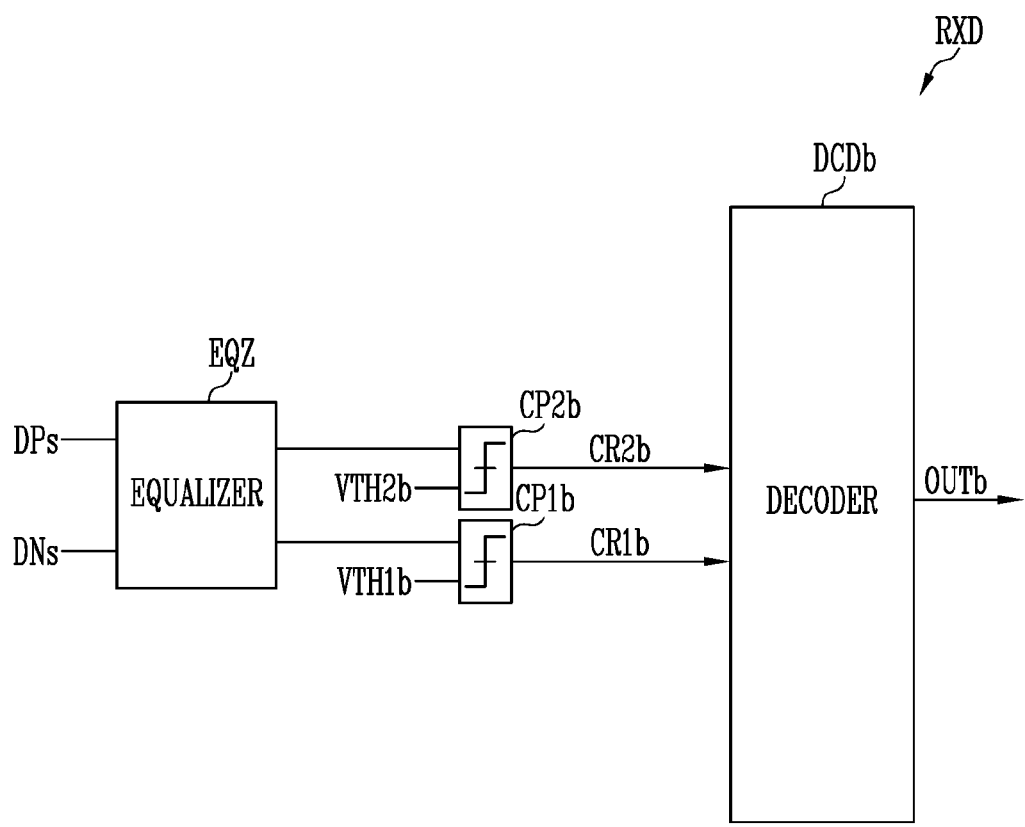

FIGS. 6 to 8 are diagrams illustrating the operation of a transceiver according to an embodiment of the present disclosure.

The receiver RXD of FIG. 7 is different from the receiver RXD of FIG. 3 in that it uses only two comparators CP1*b* and CP2*b*. According to an embodiment of FIG. 7, the receiver RXD is not capable of being used for a PAM4 method, and decoding for the patterns PTA, PTB, PTC and PTD may be performed in the same manner as in the receiver RXD of FIG. 3. The receiver RXD of FIG. 7 may be manufactured at a lower cost than the receiver RXD of FIG. 3. For convenience of explanation, a description will be made with a focus on the difference between the receiver RXD of FIG. 7 and the receiver RXD of FIG. 3, and a repeated description of elements and technical aspects previously described will be omitted.

The receiver RXD may compare the second voltage signal DNs with a first threshold voltage VTH1*b* and generate a first bit corresponding to the comparison result CR1*b*. The receiver RXD may compare the first voltage signal DPs with a second threshold voltage VTH2*b* and generate a second bit corresponding to the comparison result CR2*b*. The receiver RXD may generate a bit string in which the first bit and the second bit are combined as an output signal OUTb.

The second threshold voltage VTH2*b* may be higher than the first threshold voltage VTH1*b*. The first threshold voltage VTH1*b* may be higher than the second voltage signal DNs of the first logic level LV1. The second voltage signal DNs of the third logic level LV3 may be higher than the first threshold voltage VTH1*b*. The second threshold voltage VTH2*b* may be higher than the first voltage signal DPs of the second logic level LV2. The first voltage signal DPs of the fourth logic level LV4 may be higher than the second threshold voltage VTH2*b*.

The equalizer EQZ may equalize the first voltage signal DPs and transfer the same to the second comparator CP2*b*, and may equalize the second voltage signal DNs and transfer the same to the first comparator CP1*b*.

The first comparator CP1b may compare the first threshold voltage VTH1b with the second voltage signal DNs and generate a first comparison result CR1b. The first comparison result CR1b may include a single bit (0 or 1). For example, when the second voltage signal DNs is higher than the first threshold voltage VTH1b, the first comparison result CR1b may be 1, and when the second voltage signal DNs is lower than the first threshold voltage VTH1b, the first comparison result CR1b may be 0.

The second comparator CP2b may compare the second threshold voltage VTH2b with the first voltage signal DPs and generate a second comparison result CR2b. The second comparison result CR2b may include a single bit (0 or 1). For example, when the first voltage signal DPs is higher than the second threshold voltage VTH2b, the second comparison result CR2b may be 1, and when the first voltage signal DPs is lower than the second threshold voltage VTH2b, the second comparison result CR2b may be 0.

The decoder DCDb may generate an output signal OUTb based on the first and second comparison results CR1b and CR2b. The decoder DCDb may generate a first bit (0 or 1) corresponding to the comparison result CR1b. Also, the decoder DCDb may generate a second bit (0 or 1) corresponding to the comparison result CR2b. The decoder DCDb may generate a bit string in which the first bit and the second bit are combined as an output signal OUTb. For example, the first bit may be set as the LSB of the output signal OUTb, and the second bit may be set as the MSB of the output signal OUTb. The process of obtaining the output signal OUTb from the respective patterns PTA, PTB, PTC and PTD can be seen by referring to the table in FIG. 8.

Figure 9:
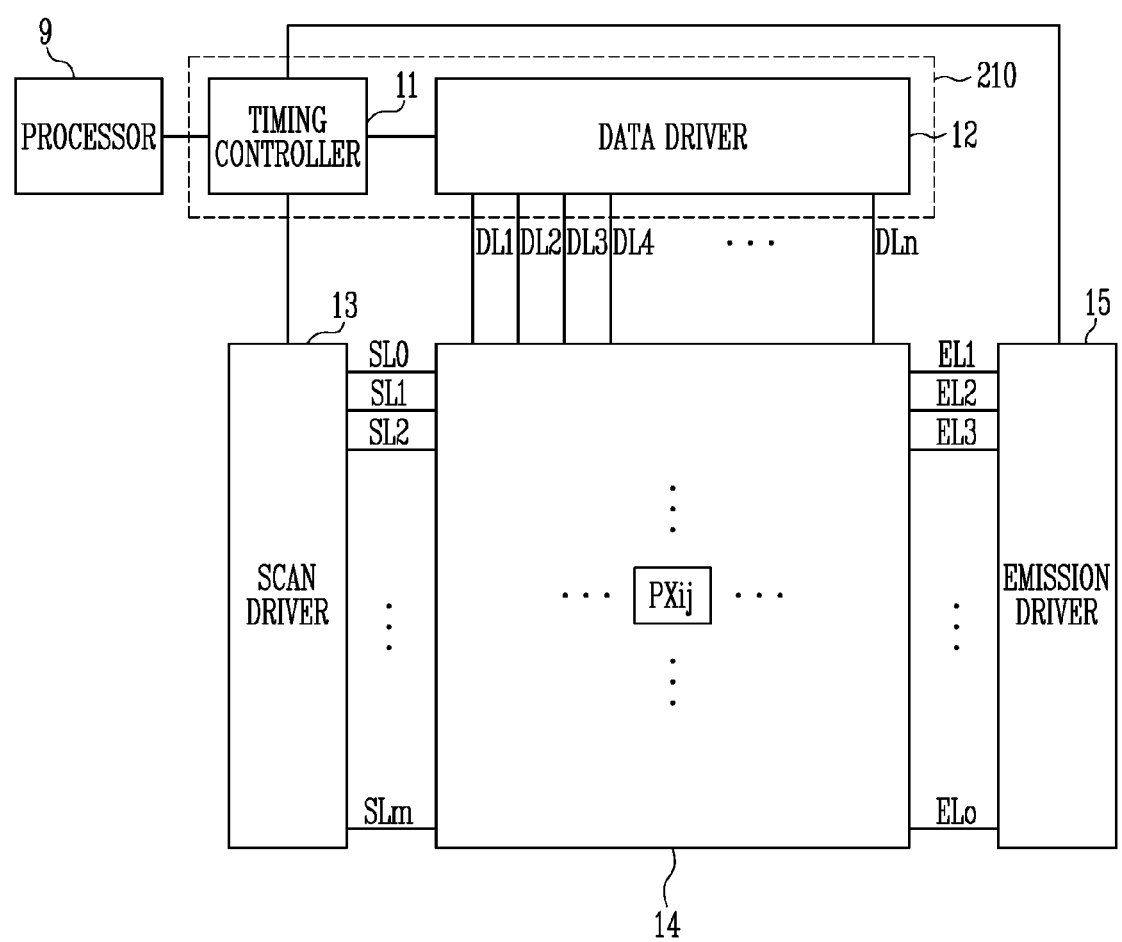
FIG. 9 is a diagram illustrating a display device according to an embodiment of the present disclosure.

FIG. 9 is a diagram illustrating a display device according to an embodiment of the present disclosure.

Referring to FIG. 9, a display device may include a timing controller 11, a data driver 12, a scan driver 13, a pixel component 14, and an emission driver 15. A determination of whether to integrate the respective functional components into a single IC or a plurality of ICs, or to be mounted on a display substrate, may be made depending on the specifications of the display device. The timing controller 11 and the data driver 12 may be configured as a single display driver 210 by being integrated into a single IC. Here, the display driver 210 may be referred to as a TCON Embedded Driver IC (TED). According to embodiments of the present disclosure, the display driver 210 may further include at least one of the scan driver 13 and the emission driver 15.

A processor 9 may correspond to at least one of a Graphics Processing Unit (GPU), a Central Processing Unit (CPU), an Application Processor (AP), etc. The processor 9 may correspond to the above-described transmitter TXD. The timing controller 11, the data driver 12, or the display driver 210 may correspond to the above-described receiver RXD (c.f., FIG. 1).

The timing controller 11 may receive grayscales and timing signals for each display frame period from the processor 9. The timing signals may include, for example, a vertical synchronization signal, a horizontal synchronization signal, a data enable signal, etc.

Each cycle of the vertical synchronization signal may correspond to each display frame period. Each cycle of the horizontal synchronization signal may correspond to each horizontal period. The grayscales may be supplied in units of horizontal lines in each horizontal period in response to the pulse of the data enable signal. The horizontal line may indicate pixels coupled to the same scan line and emission line (e.g., a pixel row).

The timing controller 11 may render the grayscales so as to correspond to the specifications of the display device. For example, the processor 9 may provide a red grayscale, a green grayscale, and a blue grayscale for each unit dot. For example, when the pixel component 14 is in an RGB stripe structure, a pixel may correspond to each grayscale in a one-to-one manner. In this case, it may be unnecessary to render the grayscales. However, when the pixel component 14 is, for example, in a PENTILE™ structure, because unit dots adjacent to each other share a pixel therebetween, a pixel may not correspond to each grayscale in a one-to-one manner. In this case, it may be necessary to render the grayscales. The grayscales that are rendered or that are not rendered may be provided to the data driver 12. Also, the timing controller 11 may provide a data control signal to the data driver 12. Also, the timing controller 11 may provide a scan control signal to the scan driver 13, and may provide an emission control signal to the emission driver 15.

The data driver 12 may generate data voltages (that is, data signals) to provide to data lines DL1, DL2, DL3, . . . , DL4, DLn using the grayscales and the data control signal received from the timing controller 11. Here, n may be an integer greater than 0.

The scan driver 13 may generate scan signals to provide to scan lines SL0, SL1, SL2, . . . , SLm using the scan control signal (e.g., a clock signal, a scan start signal, etc.) received from the timing controller 11. The scan driver 13 may sequentially supply scan signals having a pulse of a turn-on level to the scan lines SL0 to SLm. The scan driver 13 may include scan stages configured in the form of a shift register. The scan driver 13 may generate scan signals in such a way that a scan start signal in the form of a pulse of a turn-on level is sequentially transferred to the next scan stage under the control of a clock signal. Here, m may be an integer greater than 0.

The emission driver 15 may generate emission signals to provide to emission lines EL1, EL2, EL3, . . . , Elo using the emission control signal (e.g., a clock signal, an emission stop signal, etc.) received from the timing controller 11. The emission driver 15 may sequentially supply emission signals having a pulse of a turn-off level to the emission lines EL1 to ELo. The emission driver 15 may include emission stages configured in the form of a shift register. The emission driver 15 may generate emission signals in such a way that an emission stop signal in the form of a pulse of a turn-off level is sequentially transferred to the next emission stage under the control of a clock signal. Here, o may be an integer greater than 0.

The pixel component 14 includes a plurality of pixels. Each of the pixels PXij may be coupled to the data line, the scan line, and the emission line corresponding thereto. The pixels may include pixels configured to emit a first color of light, pixels configured to emit a second color of light, and pixels configured to emit a third color of light. The first color, the second color, and the third color may be different colors. For example, the first color may be one of red, green, and blue, the second color may be a color other than the first color, among red, green and blue, and the third color may be a color other than the first and second colors, among red, green and blue. Also, magenta, cyan, and yellow may be alternatively used as the first to third colors, instead of red, green and blue.

Figure 10:
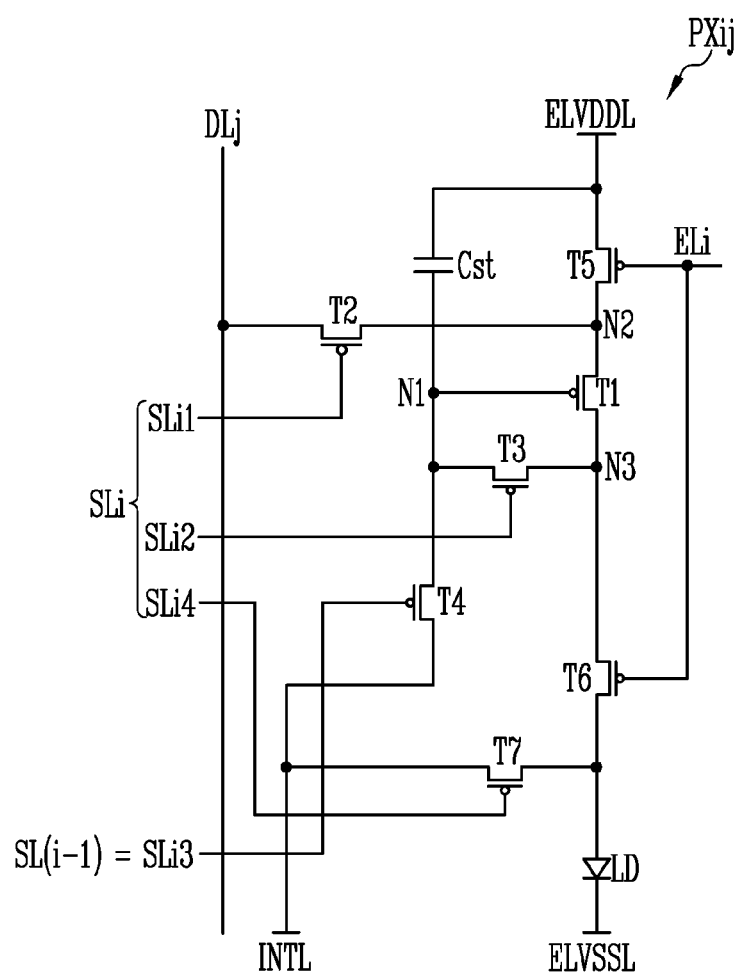
FIG. 10 is a diagram illustrating a pixel according to an embodiment of the present disclosure.

FIG. 10 is a diagram illustrating a pixel according to an embodiment of the present disclosure.

Referring to FIG. 10, a pixel PXij includes transistors T1, T2, T3, T4, T5, T6 and T7, a storage capacitor Cst, and a light-emitting element LD.

Hereinafter, a circuit configured with P-type transistors is described as an example. However, those skilled in the art will understand that a corresponding circuit may be configured with N-type transistors by changing the polarity of a voltage applied to a gate terminal. Similarly, those skilled in the art will understand that a corresponding circuit may be configured with a combination of P-type transistors and N-type transistors. A P-type transistor commonly indicates a transistor configured such that the amount of current increases when the voltage difference between a gate electrode and a source electrode increases in a negative direction. An N-type transistor commonly indicates a transistor configured such that the amount of current increases when the voltage difference between a gate electrode and a source electrode increases in a positive direction. The transistor may be configured in any of various forms, including, for example, a thin-film transistor (TFT), a field effect transistor (FET), a bipolar junction transistor (BJT), etc.

The first transistor T1 may be configured such that the gate electrode thereof is coupled to a first node N1, the first electrode thereof is coupled to a second node N2, and the second electrode thereof is coupled to a third node N3. The first transistor T1 may be referred to as a driving transistor.

The second transistor T2 may be configured such that the gate electrode thereof is coupled to a scan line SLi1, the first electrode thereof is coupled to a data line DLj, and the second electrode thereof is coupled to the second node N2. The second transistor T2 may be referred to as a scan transistor.

The third transistor T3 may be configured such that the gate electrode thereof is coupled to a scan line SLi2, the first electrode thereof is coupled to the first node N1, and the second electrode thereof is coupled to the third node N3. The third transistor T3 may be referred to as a diode-coupled transistor.

The fourth transistor T4 may be configured such that the gate electrode thereof is coupled to a scan line SLi3, the first electrode thereof is coupled to the first node N1, and the second electrode thereof is coupled to an initialization line INTL. The fourth transistor T4 may be referred to as a gate initialization transistor.

The fifth transistor T5 may be configured such that the gate electrode thereof is coupled to an i-th emission line ELi, the first electrode thereof is coupled to a first power line ELVDDL, and the second electrode thereof is coupled to the second node N2. The fifth transistor T5 may be referred to as an emission transistor. In an embodiment, the gate electrode of the fifth transistor T5 may be coupled to an emission line other than the emission line coupled to the gate electrode of the sixth transistor T6.

The sixth transistor T6 may be configured such that the gate electrode thereof is coupled to the i-th emission line ELi, the first electrode thereof is coupled to the third node N3, and the second electrode thereof is coupled to the anode of the light-emitting element LD. The sixth transistor T6 may be referred to as an emission transistor. In an embodiment, the gate electrode of the sixth transistor T6 may be coupled to an emission line other than the emission line coupled to the gate electrode of the fifth transistor T5.

The seventh transistor T7 may be configured such that the gate electrode thereof is coupled to a scan line SLi4, the first electrode thereof is coupled to the initialization line INTL, and the second electrode thereof is coupled to the anode of the light-emitting element LD. The seventh transistor T7 may be referred to as a light-emitting element initialization transistor.

The first electrode of the storage capacitor Cst may be coupled to the first power line ELVDDL, and the second electrode thereof may be coupled to the first node N1.

The light-emitting element LD may be configured such that the anode thereof is coupled to the second electrode of the sixth transistor T6 and the cathode thereof is coupled to a second power line ELVSSL. The light-emitting element LD may be a light emitting diode. The light-emitting element LD may be configured with, for example, an organic light emitting diode, an inorganic light emitting diode, a quantum dot/well light emitting diode, etc. The light-emitting element LD may emit light of any one of a first color, a second color, and a third color. Also, although a single light-emitting element LD is provided in each pixel in an embodiment illustrated in FIG. 10, a plurality of light-emitting elements may be provided in each pixel in an embodiment. Here, the plurality of light-emitting elements may be coupled to each other in, for example, series, parallel, series-parallel, etc.

A first supply voltage may be applied to the first power line ELVDDL, a second supply voltage may be applied to the second power line ELVSSL, and an initialization voltage may be applied to the initialization line INTL. For example, the first supply voltage may be higher than the second supply voltage. For example, the initialization voltage may be equal to or higher than the second supply voltage. For example, the initialization voltage may correspond to the data voltage having the smallest magnitude, among data voltages that can be provided. In an example, the magnitude of the initialization voltage may be less than the magnitudes of data voltages that can be provided.

Figure 11:
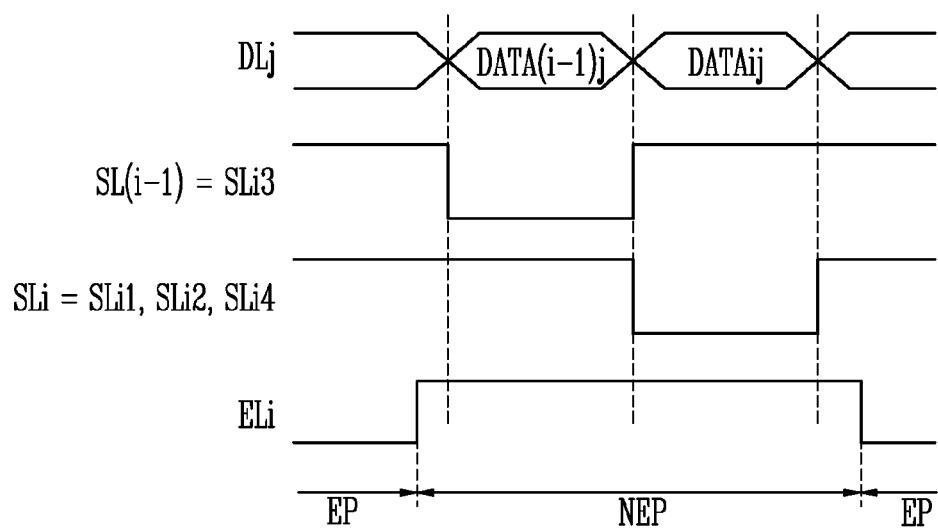
FIG. 11 is a diagram illustrating the method of driving the pixel of FIG. 10 according to an embodiment of the present disclosure.

FIG. 11 is a diagram illustrating the method of driving the pixel of FIG. 10 according to an embodiment of the present disclosure.

Hereinbelow, the case in which the scan lines SLi1, SLi2 and SLi4 are the i-th scan line SLi and in which the scan line SLi3 is the (i−1)-th scan line SL(i−1) is assumed for convenience of description. However, the scan lines SLi1, SLi2, SLi3 and SLi4 may have various coupling relationships according to embodiments. For example, the scan line SLi4 may be the (i−1)-th scan line or the (i+1)-th scan line.

First, an emission signal of a turn-off level (logic high level) is applied to the i-th emission line ELi, a data voltage DATA(i−1)j for the (i−1)-th pixel is applied to the data line DLj, and a scan signal of a turn-on level (logic low level) is applied to the scan line SLi3. High/low of a logic level may change depending on whether the transistor is P-type or N-type.

Here, because a scan signal of a turn-off level is applied to the scan lines SLi1 and SLi2, the second transistor T2 is in a turn-off state, and the data voltage DATA(i−1)j for the (i−1)-th pixel is prevented from entering the pixel PXij.

At this time, the fourth transistor T4 is in a turn-on state, so the first node N1 is coupled to the initialization line INTL, whereby the voltage of the first node N1 is initialized. Because an emission signal of a turn-off level is applied to the emission line ELi, the transistors T5 and T6 are in a turn-off state, and unnecessary emission of the light-emitting element LD according to the initialization voltage application process may be prevented.

Subsequently, a data voltage DATAij for the i-th pixel PXij is applied to the data line DLj, and a scan signal of a turn-on level is applied to the scan lines SLi1 and SLi2. Accordingly, the transistors T2, T1 and T3 switch to a conducting state, and the data line DLj and the first node N1 are electrically coupled to each other. Accordingly, a compensation voltage, acquired by subtracting the threshold voltage of the first transistor T1 from the data voltage DATAij, is applied to the second electrode of the storage capacitor Cst (that is, the first node N1), and the storage capacitor Cst retains a voltage corresponding to the difference between the first supply voltage and the compensation voltage. This period may be referred to as a threshold voltage compensation period or a data writing period.

Also, when the scan line SLi4 is the i-th scan line, because the seventh transistor T7 is in a turn-on state, the anode of the light-emitting element LD and the initialization line INTL are coupled to each other, and the light-emitting element LD is initialized with the electric charge amount corresponding to the voltage difference between the initialization voltage and the second supply voltage.

Subsequently, an emission signal of a turn-on level is applied to the i-th emission line ELi, whereby the transistors T5 and T6 may switch to a conducting state. Accordingly, a driving current path along which the first power line ELVDDL, the fifth transistor T5, the first transistor T1, the sixth transistor T6, the light-emitting element LD, and the second power line ELVSSL are coupled is formed.

Depending on the voltage retained in the storage capacitor Cst, the amount of driving current flowing in the first electrode and the second electrode of the first transistor T1 is adjusted. The light-emitting element LD emits light with luminance corresponding to the amount of driving current. The light-emitting element LD emits light before an emission signal of a turn-off level is applied to the emission line ELi.

When an emission signal is at a turn-on level, the pixels receiving the corresponding emission signal may be in a display state. Accordingly, the period in which the emission signal is at a turn-on level may be referred to as an emission period EP (or emission permission period). Also, when an emission signal is at a turn-off level, the pixels receiving the corresponding emission signal may be in a non-display state. Accordingly, the period in which the emission signal is at a turn-off level may be referred to as a non-emission period NEP (or emission prohibition period).

The non-emission period NEP described with reference to FIG. 11 may prevent the pixel PXij from emitting light with undesired luminance over the initialization period and the data writing period.

While the data written to the pixel PXij is maintained (e.g., one frame period), one or more non-emission periods NEP may be additionally provided. This may be intended to effectively represent a low grayscale or to softly blur a motion in an image by reducing the emission period EP of the pixel PXij.

The display device, the pixel, and the method of driving the same in FIGS. 9 to 11 are for describing an example to which the above-described transceiver TSCV is applied, and it is to be understood that the present disclosure is not limited to this embodiment. For example, the transceiver TSCV may be used for communication between the processor 9 included in the display device and a camera device or for communication between the processor 9 and a touch sensor (or other sensors).

The transceiver and the method of driving the transceiver according to embodiments of the present disclosure may secure high SI characteristics and reduce power consumption while maintaining the same data transmission rate when compared with an existing PAM4 method.

While the present disclosure has been particularly shown and described with reference to embodiments thereof, it will be understood by those of ordinary skill in the art that various changes in form and detail may be made therein without departing from the spirit and scope of the present disclosure as defined by the following claims.

What is claimed is:

1. A transceiver, comprising:
   a transmitter and a receiver coupled to each other through a first line and a second line,
   wherein, among a first logic level, a second logic level, a third logic level, and a fourth logic level, the transmitter transmits a first voltage signal of the second logic level or the fourth logic level, through the first line,
   wherein the transmitter transmits a second voltage signal of the first logic level or the third logic level through the second line, and
   wherein the receiver generates an output signal having one of four values based on the first voltage signal and the second voltage signal.

2. The transceiver according to claim 1, wherein
   the second logic level is higher than the first logic level,
   the third logic level is higher than the second logic level, and
   the fourth logic level is higher than the third logic level.

3. The transceiver according to claim 2, wherein the receiver generates a first comparison result by comparing the second voltage signal with each of a first threshold voltage, a second threshold voltage, and a third threshold voltage, and generates a first bit corresponding to the first comparison result.

4. The transceiver according to claim 3, wherein the receiver generates a second comparison result by comparing the first voltage signal with each of the first threshold voltage, the second threshold voltage, and the third threshold voltage, and generates a second bit corresponding to the second comparison result.

5. The transceiver according to claim 4, wherein the receiver generates a bit string in which the first bit and the second bit are combined as the output signal.

6. The transceiver according to claim 5, wherein
   the second threshold voltage is higher than the first threshold voltage, and
   the third threshold voltage is higher than the second threshold voltage.

7. The transceiver according to claim 6, wherein
   the first threshold voltage is higher than the second voltage signal of the first logic level,
   the first voltage signal of the second logic level is higher than the first threshold voltage,
   the second threshold voltage is higher than the first voltage signal of the second logic level,
   the second voltage signal of the third logic level is higher than the second threshold voltage,
   the third threshold voltage is higher than the second voltage signal of the third logic level, and
   the first voltage signal of the fourth logic level is higher than the third threshold voltage.

8. The transceiver according to claim 2, wherein the receiver comprises:
   a first comparator configured to generate a first comparison result by comparing a first threshold voltage with the second voltage signal;
   a second comparator configured to generate a second comparison result by comparing a second threshold voltage with the second voltage signal;
   a third comparator configured to generate a third comparison result by comparing a third threshold voltage with the second voltage signal;

a fourth comparator configured to generate a fourth comparison result by comparing the first threshold voltage with the first voltage signal;

a fifth comparator configured to generate a fifth comparison result by comparing the second threshold voltage with the first voltage signal; and a sixth comparator configured to generate a sixth comparison result by comparing the third threshold voltage with the first voltage signal.

9. The transceiver according to claim 8, wherein the receiver further comprises:

an equalizer configured to equalize the first voltage signal and transfer the first voltage signal to the fourth to sixth comparators, and to equalize the second voltage signal and transfer the second voltage signal to the first to third comparators; and a decoder configured to generate the output signal based on the first to sixth comparison results.

10. The transceiver according to claim 2, wherein:

the receiver generates a first comparison result by comparing the second voltage signal with a first threshold voltage and generates a first bit corresponding to the first comparison result, the receiver generates a second comparison result by comparing the first voltage signal with a second threshold voltage and generates a second bit corresponding to the second comparison result, and the receiver generates a bit string in which the first bit and the second bit are combined as the output signal.

11. The transceiver according to claim 10, wherein the second threshold voltage is higher than the first threshold voltage.

12. The transceiver according to claim 11, wherein the first threshold voltage is higher than the second voltage signal of the first logic level, the second voltage signal of the third logic level is higher than the first threshold voltage, the second threshold voltage is higher than the first voltage signal of the second logic level, and the first voltage signal of the fourth logic level is higher than the second threshold voltage.

13. The transceiver according to claim 2, wherein the receiver comprises:

a first comparator configured to generate a first comparison result by comparing a first threshold voltage with the second voltage signal; and a second comparator configured to generate a second comparison result by comparing a second threshold voltage with the first voltage signal.

14. The transceiver according to claim 13, wherein the receiver further comprises:

an equalizer configured to equalize the first voltage signal and transfer the first voltage signal to the second comparator, and to equalize the second voltage signal and transfer the second voltage signal to the first comparator; and a decoder configured to generate the output signal based on the first and second comparison results.

15. A method of driving a transceiver, including a transmitter and a receiver coupled to each other through a first line and a second line, the method comprising:

transmitting, by the transmitter, among a first logic level, a second logic level, a third logic level, and a fourth logic level, a first voltage signal of the second logic level or the fourth logic level through the first line;

transmitting, by the transmitter, a second voltage signal of the first logic level or the third logic level through the second line; and generating, by the receiver, an output signal having one of four values based on the first voltage signal and the second voltage signal.

16. The method according to claim 15, wherein the second logic level is higher than the first logic level, the third logic level is higher than the second logic level, and the fourth logic level is higher than the third logic level.

17. The method according to claim 16, further comprising:

generating, by the receiver, a first comparison result by comparing the second voltage signal with each of a first threshold voltage, a second threshold voltage, and a third threshold voltage;

generating, by the receiver, a first bit corresponding to the first comparison result comparison result;

generating, by the receiver, a second comparison result by comparing the first voltage signal with each of the first threshold voltage, the second threshold voltage, and the third threshold voltage;

generating, by the receiver, a second bit corresponding to the second comparison result; and generating, by the receiver, a bit string in which the first bit and the second bit are combined as the output signal.

18. The method according to claim 17, wherein the first threshold voltage is higher than the second voltage signal of the first logic level, the first voltage signal of the second logic level is higher than the first threshold voltage, the second threshold voltage is higher than the first voltage signal of the second logic level, the second voltage signal of the third logic level is higher than the second threshold voltage, the third threshold voltage is higher than the second voltage signal of the third logic level, and the first voltage signal of the fourth logic level is higher than the third threshold voltage.

19. The method according to claim 16, further comprising:

generating, by the receiver, a first comparison result by comparing the second voltage signal with a first threshold voltage;

generating, by the receiver, a first bit corresponding to the first comparison result;

generating, by the receiver, a second comparison result by comparing the first voltage signal with a second threshold voltage;

generating, by the receiver, a second bit corresponding to the second comparison result; and generating, by the receiver, a bit string in which the first bit and the second bit are combined as the output signal.

20. The method according to claim 19, wherein the first threshold voltage is higher than the second voltage signal of the first logic level, the second voltage signal of the third logic level is higher than the first threshold voltage, the second threshold voltage is higher than the first voltage signal of the second logic level, and the first voltage signal of the fourth logic level is higher than the second threshold voltage.

* * * * *